United States Patent
Schatz et al.

(10) Patent No.: US 6,986,278 B2
(45) Date of Patent: Jan. 17, 2006

(54) CAPPED MICROSENSOR

(75) Inventors: Frank Schatz, Kornwestheim (DE); Carsten Raudzis, Leinfelden-Echterdingen (DE); Mathias Reimann, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/838,734

(22) Filed: May 3, 2004

(65) Prior Publication Data

US 2005/0028582 A1 Feb. 10, 2005

(30) Foreign Application Priority Data

May 2, 2003 (DE) ................................ 103 19 661

(51) Int. Cl.
*G01M 3/00* (2006.01)
*G01M 3/34* (2006.01)

(52) U.S. Cl. .......................................... 73/49.3; 73/52

(58) Field of Classification Search ................. 73/49.3, 73/204.22, 204.26, 52
See application file for complete search history.

(56) References Cited

U.S. PATENT DOCUMENTS

| 4,726,233 A | * | 2/1988 | Eckardt et al. ............... 73/727 |
| 6,638,784 B2 | * | 10/2003 | Bartlett et al. ................ 438/51 |
| 2003/0033861 A1 | * | 2/2003 | Eisenschmid et al. ..... 73/61.76 |

FOREIGN PATENT DOCUMENTS

DE 101 23 920 11/2002

OTHER PUBLICATIONS

"The NanoPirani—Presumably the World's Smallest Pressure Sensor", Reyntjens, S., De Bruyker, D., Puers, R., Transducers'01, Eurosensors XV, 11th International Conference on Solid-State Sensors and Actuators, Digest of Technical Papers/Obermeier, E., Berlin, Germany, Germany: Springer-Verlag, vol. 1, 2001, 2 vol., 1807 pp. 490-493, vol. 1.*.

* cited by examiner

*Primary Examiner*—Hezron Williams
*Assistant Examiner*—Tamiko Bellamy
(74) *Attorney, Agent, or Firm*—Kenyon & Kenyon

(57) ABSTRACT

A capped microsensor is described. It is suggested that a current conductor, positioned in the cavity and having at least two voltage taps, be provided, this configuration being used for seal testing, e.g., during quality control, by detecting at least one thermodynamic variable of a gaseous medium present inside the cavity via this configuration.

6 Claims, 2 Drawing Sheets

CAPPED MICROSENSOR

FIELD OF THE INVENTION

The present invention is directed to a capped microsensor and a method for seal testing of a capped microsensor.

BACKGROUND INFORMATION

The measurement of pressures in small cavities is not possible without problems. However, it is necessary in order to determine whether the capping of microsensors is sealed or whether leaks have arisen, for example. Such a seal test is important for all hermetically capped microsensors, such as yaw rate sensors, acceleration sensors, HF-MEMS, etc.

An extremely miniaturized pressure sensor, whose sensor principle is based on a pressure-dependent heat loss of a microbridge, a gap having to exist between the microbridge and a substrate over which the microbridge is formed, is known from "The NanoPirani—Presumably the World's Smallest Pressure Sensor", Reyntjens, S., De Bruyker, D., Puers, R., TRANSDUCERS' 01, EUROSENSORS XV, 11th International Conference on Solid-State Sensors and Actuators, Digest of Technical Papers/Obermeier, E., Berlin, Germany, Germany: Springer-Verlag, vol. 1, 2001, 2 vol., 1807 pp. 490–3, Vol. 1. The heat is generated via a current flowing through the microbridge and the pressure is determined via a measurement of the electrical resistance of the microbridge.

An integrated microstructure element for detecting thermodynamic variables of a fluid is known from DE 101 23 920 A1. To detect the thermodynamic measured variables of a fluid, a circuit board or a wafer is provided having at least one microstructured heating element which is in contact with the fluid during operation, on which or in whose surroundings a first means for at least temporary application of an alternating current of defined frequency or of a defined frequency band to the heating element and further means for detecting the amplitude of the third harmonic of the electrical voltage applied to the heating element are positioned. The microstructure element shown is especially suitable for determining or monitoring the thermal conductivity and/or heat capacity of a liquid.

SUMMARY OF THE INVENTION

According to the present invention, a capped microsensor has a current conductor, positioned in the cavity, having at least two voltage taps.

Furthermore, in the method for seal testing of a capped microsensor according to the present invention, at least one thermodynamic variable of a gaseous medium present inside the capped microsensor's cavity is detected, the detection being performed using a structure, positioned inside the cavity, which is connected up into a bridge and includes a current conductor having at least two voltage taps.

In this way, according to the present invention, a microstructure sensor element that is preferably integrated into the sensor construction of the microsensor is used for detecting thermodynamic variables of a gaseous medium present inside the cavity, this microstructure sensor element being described, for example, for detecting thermodynamic variables of a fluid in DE 10123920 A1, included here through reference, through which the construction of the current conductor having at least two voltage taps, which according to the present invention is positioned in the cavity, as well as the detection of thermodynamic variables described therein are combinable with the technical features described here in particular.

The gaseous medium present inside the cavity is preferably air and the at least one of these thermodynamic variables detected is preferably its thermal conductivity and/or heat capacity. In this way, a configuration is integrated in a capped microsensor according to the present invention, via whose heat transfer coefficients, which change in the event of a pressure change, the sealing of the capped microsensor may be determined through a change of the ambient pressure. The pressure in the cavity may also be measured through the 3ω method described extensively in DE 10123920 A1, included through reference, an expanded thermal conduction model also preferably being used, which takes multilayer systems having additional cover layers into consideration, the fact being exploited that the thermal conductivity and the heat capacity of the gas surrounding the structure, e.g., the air, are pressure-dependent.

In the microsensor according to the present invention, the printed conductors forming the current conductor or the voltage taps are preferably led out of the cavity through a seal of a cap of the microsensor. Furthermore, the printed conductors forming the current conductor and/or the voltage taps preferably have terminal faces outside the cavity.

In this case, the connection of the structure into a bridge for detecting the thermodynamic variables may be performed outside the cavity, i.e., the structure may simply be connected to a measuring device, using which it may be determined whether the capped microsensor is sealed.

In a first preferred embodiment of the seal testing, a constant heating current is driven through the current conductor, the bridge is balanced at a constant ambient pressure, and a pressure change in the cavity in the event of changing ambient pressure is detected by detecting a change in a bridge voltage. In this way, as specified above, a dependence of the bridge voltage on the pressure, because of the heat transfer coefficients of the configuration which change with pressure, i.e., the temperature change of the current conductor associated therewith, through which the resistance changes via the temperature coefficients, is exploited in order to perform the seal testing of the capped microsensor.

In a second preferred embodiment according to the present invention, the pressure in the cavity is detected using the 3ω method, an expanded thermal conduction model preferably being used for the 3ω method—as specified above—which takes multilayer systems having additional cover layers into consideration, the gaseous medium surrounding the structure being treated as a cover layer. In this way, the effect that thermal conductivity and heat capacity of the gaseous medium, preferably air, are pressure-dependent is exploited. The structure described, having resistance bridges connected thereto, preferably externally, is also used for the pressure measurement inside the cavity via the 3ω method.

In the microsensor according to the present invention and described above, the printed conductors forming the current conductor and/or the voltage taps are preferably formed integrally with a sensor element of the microsensor, e.g., with the uppermost metal layer of a sensor. In this way, according to the present invention, a flat system that is simple to manufacture is specified, which allows the cost-effective manufacture of the measurement structures in accordance with standard semiconductor processes.

The method according to the present invention and described above for seal testing of a capped microsensor is preferably used for quality control of a cap of the capped microsensor.

DETAILED DESCRIPTION

Figure 1:
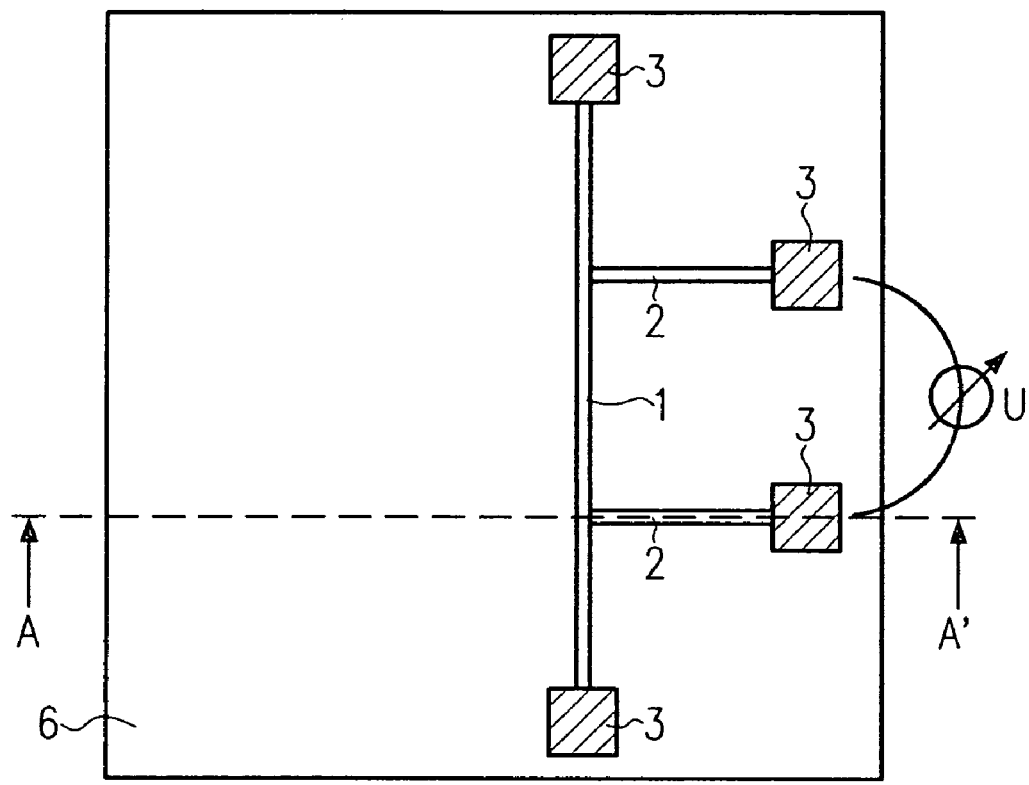
FIG. 1 shows a top view of a capped microsensor according to the present invention without capping.

In the following, a capped microsensor according to the present invention is described with reference to FIGS. 1 and 2. FIG. 1 shows a microsensor according to the present invention which is not yet capped, the elements of the actual microsensor not necessary for implementing the present invention not being shown.

A current conductor 1, which has two voltage taps 2, is applied to a substrate 6 of the microsensor. Contact pads 3 are provided at the ends of current conductor 1 and at the ends of both voltage taps 2. The printed conductors forming current conductor 1, both voltage taps 2, and contact pads 3 may be manufactured using the uppermost metal layer of the microsensor, for example.

Reference is made to DE 101 23 290 A1, which is included by reference, for the selection of specific materials and in regard to a special configuration of current conductor 1 and voltage taps 2.

According to the present invention, current conductor 1 and voltage taps 2 lie inside a cavity 5 produced by a cap of the microsensor, but the printed conductors are preferably so long that contact pads 3 lie outside cavity 5, i.e., may still be contacted after the mounting of cap 4.

Figure 2:
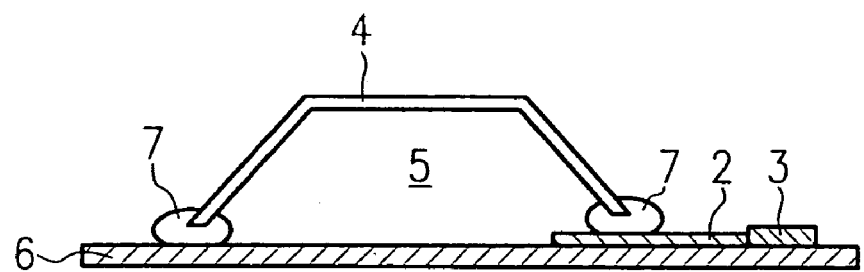
FIG. 2 shows a sectional view of the microsensor according to the present invention shown in FIG. 1 with capping along the line A–A' shown in FIG. 1.

FIG. 2 shows a sectional illustration of the already capped microsensor along line A–A' shown in FIG. 1. It may be seen that cap 4 seals cavity 5 to the environment together with a seal 7. This sealing is preferably also performed at the bushings of the printed conductors for current conductor 1 and both voltage taps 2.

Testing of the hermetic sealing of the microsensor capping is preferably performed according to the present invention as a quality control for the capping of the microsensor in that the printed conductors allowing 4-point measurements are connected into a bridge using external resistors and at least one thermodynamic variable of the gaseous medium, preferably air, present inside cavity 5, is detected via the printed conductors allowing 4-point measurements, from which the seal-tightness of cavity 5 may be concluded.

In the following, two preferred embodiments of the method according to the present invention for seal testing of a capped microsensor are described with reference to FIGS. 3 and 4.

Figure 3:
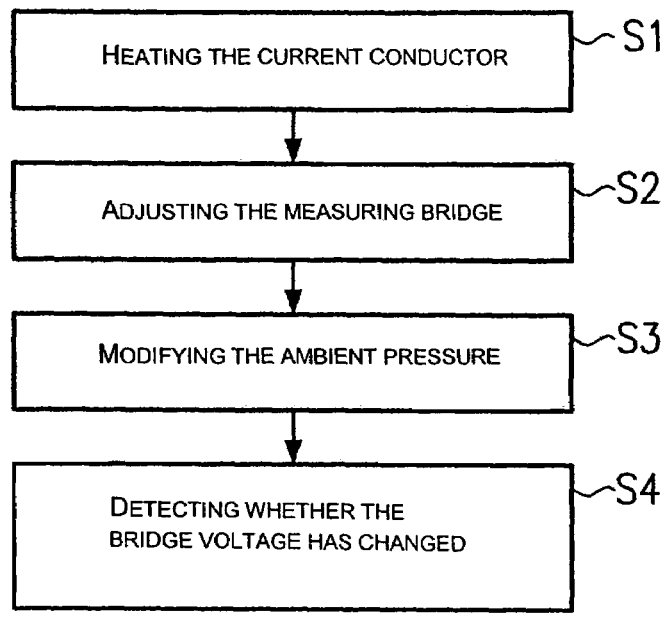
FIG. 3 shows a flowchart of the method for seal testing of a capped microsensor according to a first preferred exemplary embodiment of the present invention.

According to the first preferred exemplary embodiment of the method for seal testing of a capped microsensor according to the present invention and shown in FIG. 3, a constant heating current is driven through current conductor 1 using a current source in a step S1 and the bridge is balanced at a constant ambient pressure in a following step S2. If the ambient pressure varies, e.g., through environmental influences in use or provoked by reliability tests, the bridge voltage changes as a function of the pressure because of the heat transfer coefficients of the configuration, which change, since the temperature of the current conductor and therefore the resistance change via the temperature coefficients. According to the present invention, the ambient pressure, for example, is therefore changed in a next step S3, after which it is detected in a following step S4 whether the bridge voltage has changed. If not, the pressure inside the capping has remained constant, through which it is recognized that the capping is sealed. However, if the bridge voltage changes, the capping is classified as leaky.

Figure 4:
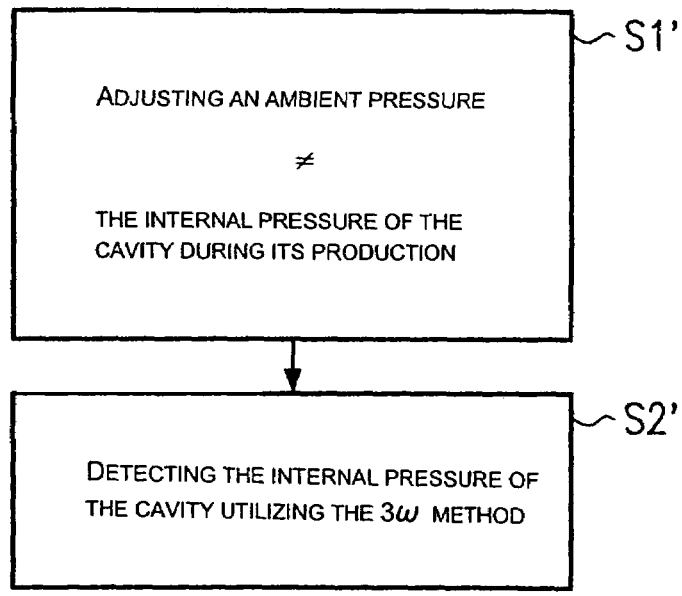
FIG. 4 shows a flowchart of the method for seal testing of a capped microsensor according to a second preferred exemplary embodiment of the present invention.

FIG. 4 shows a second preferred exemplary embodiment of the method according to the present invention for seal testing of a capped microsensor, in which the pressure in the cavity is measured via the 3ω method. The use of the structure, including a current conductor having two voltage taps, with the aid of the external resistance bridge for the 3ω method is extensively described in DE 101 23 920 A1, which is included by reference. According to the present invention, an expanded thermal conduction model is preferably used for the 3ω method, which takes multilayer systems having additional cover layers into consideration. The ambient air preferably used as the gaseous medium inside cavity 5 is treated in this case as a cover layer, the thermal conductivity and the heat capacity of the air being pressure-dependent.

According to the second preferred method for seal testing of a capped microsensor according to the present invention, in a step S1', an ambient pressure not equal to the internal pressure of the cavity is set during its manufacture. In a following step S2', the internal pressure of the cavity is detected using the 3ω method. If this pressure is equal to the internal pressure of the cavity during its manufacture, the capping is classified as sealed, while in contrast a deviating measured ambient pressure, e.g., the set ambient pressure, indicates leaky capping.

The method according to the present invention for seal testing may be used both for process control directly after capping, in order to test whether the sealing process was performed properly, and for testing the long-term sealing over the service life of the sensor element.

What is claimed is:

1. A method for seal testing of a capped microsensor, comprising:
   detecting at least one thermodynamic variable of a gaseous medium present inside a cavity of the capped microsensor using a structure, the structure being positioned inside the cavity, the structure being connected up into a bridge and being made up of a current conductor having at least two voltage taps.

2. The method as recited in claim 1, wherein:
   the connection of the structure into the bridge is performed outside the cavity.

3. The method as recited in claim 1, further comprising:
   driving a constant heating current through the current conductor;
   balancing the bridge at a constant ambient pressure; and
   detecting a pressure change in the cavity in response to a change in the ambient pressure by detecting a change in a bridge voltage.

4. The method as recited in claim 1, further comprising:
   detecting a pressure in the cavity using the 3ω method.

5. The method as recited in claim 4, wherein:
   an expanded thermal conduction model is used for the 3ω method, the model taking multilayer systems having additional cover layers into consideration, the gaseous medium surrounding the structure being treated as a cover layer.

6. The method as recited in claim 1, wherein:
   the method is for quality control of a cap of the capped microsensor.

* * * * *